(12) United States Patent
Takehara et al.

(10) Patent No.: US 6,794,747 B2
(45) Date of Patent: Sep. 21, 2004

(54) SEMICONDUCTOR DEVICE

(75) Inventors: Hideki Takehara, Kobe (JP); Kunihiko Kanazawa, Mukou (JP); Noriyuki Yoshikawa, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/648,697

(22) Filed: Aug. 26, 2003

(65) Prior Publication Data
US 2004/0041256 A1 Mar. 4, 2004

(30) Foreign Application Priority Data
Aug. 28, 2002 (JP) ........................................ 2002-249646

(51) Int. Cl.[7] .............................................. H01L 23/15
(52) U.S. Cl. ........................ 257/705; 257/723; 257/701
(58) Field of Search ................................ 257/700, 701, 257/675, 685, 723, 705

(56) References Cited

U.S. PATENT DOCUMENTS

| | | | |
|---|---|---|---|
| 6,072,122 A | * | 6/2000 | Hosoya ..................... 174/52.4 |
| 6,114,413 A | | 9/2000 | Kang et al. |
| 6,320,543 B1 | * | 11/2001 | Ohata et al. ......... 343/700 MS |
| 6,630,727 B1 | | 10/2003 | Tutsch et al. |
| 2002/0049042 A1 | | 4/2002 | Oida et al. |

FOREIGN PATENT DOCUMENTS

| | | |
|---|---|---|
| DE | 198 08 986 | 9/1999 |
| EP | 0 933 816 | 8/1999 |
| JP | 10-37054 | 2/1998 |
| JP | 2000-216307 | 8/2000 |
| JP | 2002-9225 | 1/2002 |

* cited by examiner

Primary Examiner—Roy Potter
(74) Attorney, Agent, or Firm—Merchant & Gould P.C.

(57) ABSTRACT

The present invention provides a semiconductor device comprising as a core substrate a high thermo conductive ceramic substrate having circuit patterns on opposed surfaces. The high thermo conductive ceramic substrate has on one surface a first circuit board of at least one layer having a first cavity structure, and on the other surface a second circuit board of at least one layer having a second cavity structure. A first active element is mounted on the circuit pattern on the high thermo conductive ceramic substrate within the first cavity, a second active element is mounted on the circuit pattern on the high thermo conductive ceramic substrate within the second cavity, an external electrode is integrated with the surface of the second circuit board, and the first circuit board surface is equipped with a cap or sealed with resin. A heat dissipation via is formed on the second circuit board, the high thermo conductive ceramic substrate and the external electrode on the surface of the second circuit board are connected thermally to each other, and heat of at least one active element selected from the first active element and the second active element is dissipated outward through the high thermo conductive ceramic substrate, the heat dissipation via and the external electrode on the surface of the second circuit board. The semiconductor device is downsized while securing transverse strength and heat dissipation characteristics of a heat-generating semiconductor element.

20 Claims, 6 Drawing Sheets

SEMICONDUCTOR DEVICE

FIELD OF THE INVENTION

The present invention relates to a semiconductor device formed by packaging on a laminated substrate a semiconductor element and an electronic component as a peripheral circuit. More specifically, the present invention relates to a module structure.

BACKGROUND OF THE INVENTION

Recently proposed semiconductor devices are applied to transmission amplifiers used in portable phones or the like, and such semiconductor devices have a multilayer substrate on which an amplifying high-frequency power semiconductor element and a chip component for forming a matching circuit are provided (see, for example, JP 10(1998)-37054A, JP 2000-216307A, and JP 2002-9225A). A conventional semiconductor device will be described below by referring to FIG. 11. In FIG. 11, numeral 1 denotes a high-frequency power semiconductor element, 2 denotes an alumina substrate or a ceramic multilayer substrate such as a low temperature cofired ceramic hereinafter, referred to as LTCC) substrate. Each numeral 3 denotes a chip component such as a chip capacitor, a chip resistor or a chip inductor. Numerals 4, 5, 6, 7, and 8 denote respectively an external connection electrode, a metal wire, a connection pad at a cavity step, a potting resin, and a metal cap. A component-packaging land and a circuit pattern are formed by screen-printing on the surface of the ceramic multilayer substrate. The high-frequency power semiconductor element 1 is mounted within a cavity 12 on the back face of the ceramic multilayer substrate 2, electrically connected by the metal wire 5 to the connection pad 6 at the cavity step, and sealed with the metal wire 5 by the potting resin 7 for the purpose of protection. The chip components 3 are packaged as well at predetermined positions by a solder 15. On the ceramic multilayer substrate 2, the metal cap 8 is attached as a case. Furthermore, the external connection electrode 4 on the back face of the ceramic multilayer substrate 2 is electrically connected through a via hole 27 penetrating the ceramic multilayer substrate 2 to an inner layer pattern formed among layers of the substrate and the connection pad 6, and also to the component-packaging land.

However, the conventional semiconductor device configured by only mounting a semiconductor element and chip components on a ceramic multilayer substrate cannot correspond to further miniaturization of a package under a situation in which the number of packaging components increases to provide an amplifier circuit with a higher performance. Thus a semiconductor device with a new structure is required. Furthermore, since a power semiconductor element as a heater element is packaged on the ceramic multilayer substrate, the whole heat generated by the semiconductor chip is conducted below through all of the ceramic multilayer substrates and discharged through a bottom electrode. However, the ceramic multilayer substrate has a high heat resistance, and it is difficult to arrange the via hole 27 in the vicinity of the high-frequency power semiconductor element. As a result, a semiconductor chip consuming high power will be in a high temperature state due to insufficient heat dissipation.

A LTCC substrate is rather preferred from an aspect of miniaturization of a package, since it allows simultaneous formation of a printed resistor, a laminate capacitor, and an inductor provided by a circuit pattern during a low temperature cofiring, thereby decreasing the number of electronic components on the substrate surface. However, since the LTCC has a thermal conductivity about one-tenth that of an alumina substrate fired at a high temperature, heat dissipation of the semiconductor chip will deteriorate. In addition, the LTCC substrate tends to be quite fragile since the transverse strength of the LTCC is lower than that of the alumina substrate.

Although an alumina substrate has good thermal conduction and high transverse strength, it cannot include a component function within the substrate because the firing temperature is high. As a result, the alumina substrate cannot be miniaturized when the number of the components increases.

SUMMARY OF THE INVENTION

For solving the above-described problems, an object of the present invention is to provide a downsized semiconductor device securing heat dissipation characteristics and a transverse strength. The semiconductor device is provided by packaging on a laminated substrate having a component function, a power semiconductor element, a controlling semiconductor element, a filter element, a switching element and a chip electronic component as a peripheral circuit.

For achieving the above-mentioned object, a semiconductor device according to the present invention includes as a central substrate a high thermo conductive ceramic substrate having circuit patterns formed on opposed surfaces; wherein at least one layer of a first circuit board having a first cavity structure is provided on one surface of the high thermo conductive ceramic substrate, at least one layer of a second circuit board having a second cavity structure is provided on the other surface, a first active element is mounted on a circuit pattern on the high thermo conductive ceramic substrate within the first cavity, a second active element is mounted on a circuit pattern on the high thermo conductive ceramic substrate within the second cavity, an external electrode is integrated with a surface of the second circuit board, and the first circuit board surface is equipped with a cap or sealed with resin. The semiconductor device is characterized in that a heat dissipation via is formed on the second circuit board, the high thermo conductive ceramic substrate and the external electrode on the second circuit board surface are connected thermally, and heat from at least one active element selected from the first and second active elements is dissipated outward through the high thermo conductive ceramic substrate, the heat dissipation via hole and the external electrode on the second circuit board surface.

DETAILED DESCRIPTION OF THE INVENTION

Figure 1A:
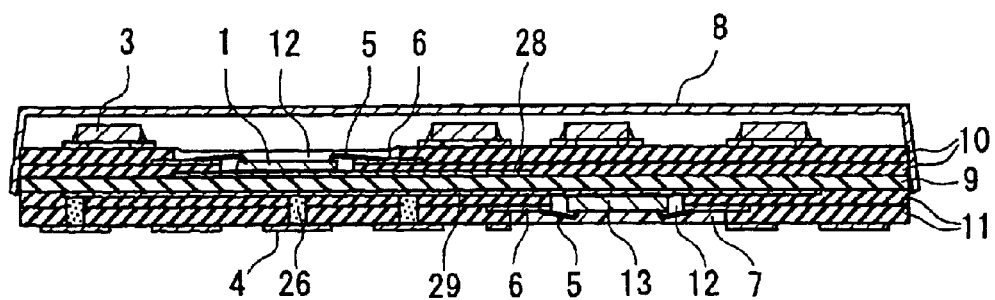
FIG. 1A is a cross-sectional view showing a semiconductor device according to a first embodiment of the present invention.

An object of the present invention is to provide a high-frequency amplifier circuit device. The circuit device includes a high thermo conductive ceramic substrate such as an alumina substrate as a core material. On the high thermo conductive ceramic substrate, a LTCC multilayer substrate having a cavity structure and a component function is formed. A power semiconductor element is packaged within the cavity, and chip components are packaged on the substrate. Furthermore, a LTCC multilayer substrate having a component function and having a cavity structure and an external connection electrode is formed on the back face of the alumina substrate. A controlling semiconductor element is packaged within the cavity, and the cavity is sealed with a metal cap.

In the present invention, a high thermo conductive ceramic substrate is used as a core material and a semiconductor element is adhered directly onto the substrate. Thereby, heat generated at the semiconductor element is conducted to the high thermo conductive ceramic substrate. The heat spreads further in the lateral direction on the whole surface of the high thermo conductive ceramic substrate so as to be conducted downward from the whole surface of the high thermo conductive ceramic substrate through the second ceramic substrate, and thus heat resistance can be decreased in comparison with a case of using a LTCC multilayer substrate alone. Moreover, since the high thermo conductive substrate is used at locations for heat dissipation, the first and second ceramic substrates can be selected in accordance with characteristics other than the thermal characteristics, i.e., dielectric constant and necessity for component functions. For example, when selecting LTCC substrates for the first and second ceramic substrates, passive components such as resistors, capacitors and inductors can be included in the substrate. As a result, the wiring is shortened to lower impedance, while the number of the external components is decreased to downsize the substrate. Moreover, since the first semiconductor element and the second semiconductor element are mounted respectively on the surface and the back face of the high thermo conductive ceramic substrate, the wiring to connect the first and second semiconductor elements is shortened so as to lower the impedance and reduce the thickness of the substrate.

According to the present invention, the heat generated by the semiconductor elements is conducted to the first high thermo conductive ceramic substrate and spread in the lateral direction all over the first high thermo conductive ceramic substrate, then conducted downward from the whole first high thermo conductive ceramic substrate to a second ceramic substrate and spread all over the second high thermo conductive ceramic substrate. As a result, the heat resistance is reduced further. Moreover, since the first semiconductor element and the second semiconductor element are mounted respectively on the circuit patterns formed on the surface and the back face of the substrate, the wiring to connect the semiconductor elements can be shortened for lowering the impedance. Furthermore, due to the use of a dual layer high thermo conductive ceramic substrate, the traverse strength of the entire substrate can be improved.

In the present invention, it is preferable that either the first active element or the second active element is a high-frequency power semiconductor element, while the other is a controlling semiconductor element having a function of driving and controlling the power semiconductor element, and a surface mounting component is mounted on the first ceramic substrate. Thereby, the power semiconductor element is adhered directly onto a high thermo conductive ceramic substrate as a core material so as to dissipate heat of the power semiconductor element directly to the high thermo conductive ceramic substrate, and thus the heat resistance can be decreased in comparison with a case of using a LTCC multilayer substrate. Since a controlling semiconductor element for driving and controlling the power semiconductor element is packaged on a side of the high thermo conductive ceramic substrate, the wiring to connect the power semiconductor element and the controlling semiconductor element can be shortened to lower the impedance. Furthermore, by using materials such as an alumina for the substrate core material, the traverse strength can be improved about 1.5 times in comparison with a case of a LTCC substrate. Therefore, the heat dissipation and the traverse strength of the semiconductor amplifier circuit device can be improved further.

It is preferable that either the first active element or the second active element is a filter element, while the other is a switching element. Accordingly, since the filter element is mounted on a high thermo conductive ceramic substrate as a core material and the switching element is mounted on the other surface, the wiring to connect the elements can be shortened so as to provide a filter-equipped antenna switching device with lowered impedance. Furthermore, by using materials such as alumina for the core, the traverse strength can be improved to about 1.5 times in comparison with a case of a LTCC substrate.

It is preferable that a region for mounting a power semiconductor element is provided on the first ceramic substrate, on which a via hole filled with a metal or a metal-containing resin is formed and thermally connected with the high thermo conductive ceramic substrate. This configuration does not always require a stepped cavity on the first ceramic substrate at a portion for mounting the power semiconductor element. When a thermal via filled with a metal or a metal-containing resin is provided at a region to mount a power semiconductor element, the heat resistance can be lowered as in the case that the power semiconductor element is adhered directly onto the high thermo conductive ceramic substrate. When a region for mounting a power semiconductor element is large, the opening for a cavity structure is increased and the thickness of the ceramic substrate is reduced comparatively. In such a case, a non-fired sheet is easy to break during a manufacture of the substrate. The method of filling a thermal via heat is effective for such a case, since it will not form a big opening or dissipate heat.

In the semiconductor device, the first ceramic substrate can be replaced by a resin-based substrate. In the substrate, the impedance can be lowered by use of copper wiring, and a fine pattern can be formed. Moreover, use of a thick copper wiring will allow formation of a circuit pattern with a low resistance and high heat dissipation. Furthermore, the copper wiring serves to improve the solder wettability of the chip component, thereby improving the packaging yield. For dealing with the issue of heat instability due to the recent trend for excluding lead from solder, the copper wiring is useful in improving the heat resistance of the solder.

In the above description, the resin substrate is prepared, for example, by impregnating an epoxy resin in an aramid non-woven fabric, a glass woven fabric, or a glass non-woven fabric. Examples of such substrates are described in JP 10 (1998)-37054A.

In the present invention, a first ceramic substrate is formed on the surface of a high thermo conductive ceramic substrate made of alumina or the like. On the surface layer or the inner layer of the first ceramic substrate, a circuit pattern or a via hole to be connected to a ground is formed at spacing among cavities, and a power semiconductor element and a filter element are mounted in the cavities. Therefore, mutual intervention of signals between the power semiconductor element and the filter semiconductor element can be decreased so as to maximize the permeation characteristic of the filter element. Furthermore, a second ceramic substrate is formed on the back face of the high thermo conductive substrate made of alumina or the like. The second ceramic substrate has a circuit pattern or a via hole formed in spacing among the cavities and connected to a ground, and a controlling semiconductor element and a switching element are mounted within the cavities. Thereby, mutual intervention between the high thermo conductive element and the switching element can be decreased. The thus provided transmission Tx module including a high thermo conductive ceramic substrate as a core material can reduce heat resistance. Furthermore, the Tx module provided with a power semiconductor element, a filter element, a controlling semiconductor element and a switching element can suppress mutual intervention among the elements.

It is preferable in the semiconductor device that a filter element mounted on a first ceramic substrate, e.g., a SAW (surface acoustic wave) filter, a dielectric filter, and a high-frequency resonance (LC) filter; a controlling semiconductor element or a switching element is packaged on the substrate by flip-chip bonding. In this configuration, since the filter element, a controlling semiconductor element, or a switching element is mounted on the high thermo conductive ceramic substrate by flip-chip bonding, the thickness of the first ceramic substrate and the second ceramic substrate formed with cavities can be reduced to a level allowing the packaging, thereby the whole thickness of the device can be reduced. Moreover, both the impedance and the stray capacitance can be lowered in comparison with a configuration having a metal wire for connection. Furthermore, a wire bond pad at the substrate side, which has been required for wire connection, can be omitted so as to decrease the diameters of the cavities.

It is preferable in the high-frequency amplifier circuit device that: a plurality of cavities are formed in a first ceramic substrate; a circuit pattern is formed among the cavities so as to be connected to a ground of a filter element; a plurality of stepped cavities are formed in a second ceramic substrate; a circuit pattern to be connected to the ground is formed in particular regions described below; a controlling semiconductor element and a switching element are mounted on the circuit patterns on the high thermo conductive ceramic substrate within the cavities of the first ceramic substrate; a power semiconductor element and a filter element are mounted by flip-chip bonding on the circuit pattern on the high thermo conductive ceramic substrate within the cavities of the second ceramic substrate; a metal plate and the circuit patterns at the cavity step of the second ceramic substrate are adhered and sealed with a metal or an electroconductive adhesive. The circuit pattern described above is formed, in the cavities for the filter element, in a region adjacent to the cavity of the high thermo conductive ceramic substrate made of alumina, aluminum nitride, graphite, silicon carbide or the like; a region of the steps of the cavities and a region in the vicinity of the steps; a region located on the back face of the cavity for the filter element on high thermo conductive ceramic substrate; and spacing among the plural cavities of the second ceramic substrate. In this configuration, the controlling semiconductor element and the switching element are mounted in the cavities of the first ceramic substrate by flip-chip bonding, and thus wire connection pads to be formed at the steps of the cavities can be omitted to decrease the diameter of the cavities. This results in an increase of areas for mounting chips and patterns of external circuit components. In the cavities for the filter element in the second ceramic substrate, the circuit pattern of the ground arranged to surround the filter element serves to improve isolation between the filter element and any other elements, thereby reducing the mutual intervention of signals. Furthermore, a hermetically sealed structure required for the filter element can be obtained easily by only covering the cavity in the second ceramic substrate with a metal plate.

In the present invention, the core substrate of the high thermo conductive ceramic substrate is made of alumina, aluminum nitride, graphite, silicon carbide, or boron nitride, thereby the transverse strength of the entire substrate can be improved remarkably in comparison with a case of a LTCC substrate.

In the present invention, it is preferable that the thermal conductivity of the high thermo conductive ceramic substrate is at least 10 W/m·K.

A heat dissipation external electrode on the surface of the second circuit board can be connected to a ground. In this case, the heat dissipation via functions also as an electroconductive via.

It is also preferable that the heat dissipation via is formed by filling the via hole with an electroconductive paste containing a metal filler of 65 wt % to 95 wt % and a thermosetting resin of 5 wt % to 35 wt %, and curing the paste, so that the heat dissipation characteristics can be improved. The electroconductive paste can be cured with application of heat and pressure. For example, the preferred temperature is from 80° C. to 200° C., and the preferred pressure is from $1.47 \times 10^6$ Pa (15 kg/cm$^2$) to $9.8 \times 10^6$ Pa (100 kg/cm$^2$). A preferred diameter for the heat dissipation via is from 100 μm to 300 μm. A preferred distance/pitch between heat dissipation vias is at least 150 μm for vias having a diameter of 100 μm, and at least 450 μm for vias having a diameter of 300 μm.

It is preferable that the heat dissipation vias are arranged on the back face side or in the vicinity of the first and second semiconductor elements. Here, the expression of "vicinity" indicates a range from the end of a semiconductor element to the end of a via, i.e., a range of 1 mm or less.

The present invention can provide a semiconductor device including a power semiconductor element, a controlling semiconductor element, a filter element, a switching element and a chip electronic component as a peripheral circuit that are mounted on a laminated substrate including a component function, thereby securing its heat dissipation and transverse strength while downsizing the semiconductor device.

The high-frequency amplifier circuit device of the present invention will be described below by referring to the attached drawings.

First Embodiment

A first embodiment of the present invention will be described by referring to FIGS. 1A and 1B. FIG. 1A is a schematic cross-sectional view showing a semiconductor device. This semiconductor device is produced by laminating a LTCC substrate 10 on the surface of an alumina ceramic substrate 9 as a core material and a LTCC substrate 11 on the back face of the same substrate 9. The LTCC substrates 10 and 11 are multilayer substrates having stepped cavities. Each substrate has an outer dimension of 10 mm□ (here, '□' indicates square, or longitudinal and cross dimensions) and a thickness of 1.3 mm. When viewed from above, the LTCC substrate 10, the alumina substrate 9 and the LTCC substrate 11 are laminated in this order. Numeral 28 denotes a layer of a first circuit board formed on the surface of the LTCC substrate 10, and 29 denotes a layer of a third circuit board formed on the surface of the LTCC substrate 11. A second circuit board is formed on the back face of the LTCC substrate 10, which is omitted from the drawing.

The LTCC substrate 10 is a multilayer substrate consisting of two layers, where the dielectric constant $\epsilon$=7.8, the thermal conductivity is 3 W/m·K, and the thickness is 0.5 mm. A stepped cavity of 2.5×2 mm is formed in the substrate, and on the surface, a land for mounting an external circuit pattern and an external chip component is formed. At the cavity, the circuit pattern formed on the alumina substrate is exposed. The alumina substrate 9 as a core material has a dielectric constant $\epsilon$ of 10, a thermal conductivity of 24 W/m·K, and a thickness of 0.3 mm. The LTCC substrate 11 provided on the back face side of the alumina substrate is a multilayer substrate of two layers, having a dielectric constant $\epsilon$ of 7.8, a thermal conductivity of 3 W/m·K, and a thickness of 0.5 mm. On the substrate, a stepped cavity 12 of 3.5 mm□ and an electrode 4 for external connection (e.g., ground) are formed, and at the cavity, the circuit pattern formed on the alumina substrate is exposed.

The LTCC substrates 10 and 11 respectively include resistors, capacitors and inductors (not shown), providing effects in decreasing the number of the external components and downsizing of the substrates caused by the same, and also in lowering the impedance of the wiring. The capacity range is 100 Ω to 1 MΩ for the resistor, 1 pF to 10 nF for the capacitor, and 10 nH or less for the inductor.

An amplifying high-frequency power semiconductor element 1 is adhered by means of a metal and an electroconductive adhesive onto a pattern on the alumina substrate 9 within the cavity 12 of the LTCC substrate 10, and connected by a metal wire 5 to a connection pattern 6 at the cavity step of the substrate 10. The high-frequency power semiconductor element 1 has an output of at least 20 dbB at a frequency of at least 500 MHz. The high-frequency power semiconductor element 1 is 1.6×0.5 mm and 100 µm in thickness. On the pattern of the alumina substrate 9 within the cavity 12 of the LTCC substrate 11, a controlling semiconductor element 13 for driving and controlling the high-frequency power semiconductor element 1 is adhered by a pressure-sensitive adhesive tape and an electroconductive adhesive, and connected by the metal wire 5 to a connection pad 6 at the cavity step of the substrate 11. The controlling semiconductor element is 2.0 mm□, and 150 µm in thickness.

On the surface of the LTCC substrate 10, chip components 3 such as a resistor, a capacitor and an inductor are solder-packaged, and a matching circuit is formed with the chip components 3 and the resistors, capacitors, and inductors included in the LTCC substrates 10, 11.

The cavities 12 on which the high-frequency power semiconductor element 1 and the controlling semiconductor element 13 are mounted are sealed with the epoxy resin 7 in order to protect the elements.

The semiconductor device is processed further, for example, by attaching a cap 8 at the side of the LTCC substrate 10 and sealing the entire surface of the LTCC substrate side by means of an epoxy resin. FIG. 1A shows an example of attaching a metal cap.

Figure 1B:
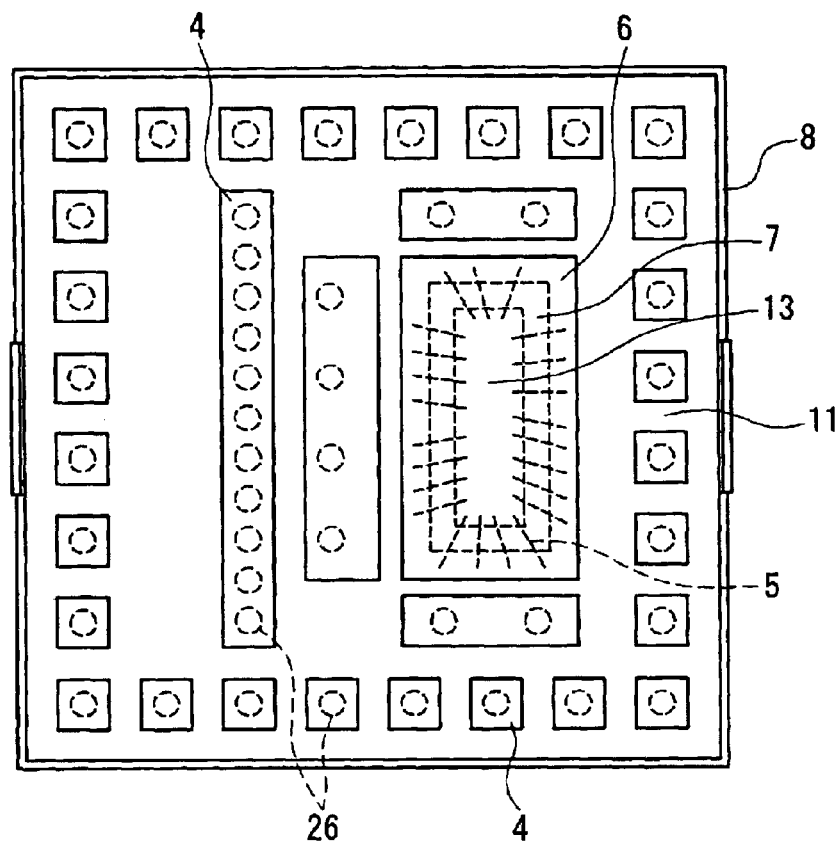
FIG. 1B is a back view showing the same semiconductor device.

FIG. 1B is a back view of FIG. 1A.

Since a high-frequency power semiconductor element is adhered directly on an alumina substrate as a core material 0.3 mm in thickness, the heat generated at the high-frequency power semiconductor element can be dissipated directly to the alumina substrate. Typically, an alumina substrate has a thermal conductivity about 10 times that of a LTCC substrate. According to this embodiment, providing a structure of laminating LTCC substrates on both surfaces of an alumina substrate as a core material can provide a suppressed heat resistance as favorable as that of the alumina substrate. Through-holes are formed in the LTCC substrate 11, and the through-holes are filled with an electroconductive paste to form heat dissipation vias 26 that are connected electrically and thermally to an electrode 4. The heat dissipation vias 26 are arranged at the opposite side or in the vicinity of the high-frequency power semiconductor element 1. Therefore, heat from the high-frequency power semiconductor element 1 is conducted and dissipated, through the alumina substrate 9, the heat dissipation vias 26 and the electrode 4, to a copper pattern on a printed circuit board to which this semiconductor device is packaged.

Figure 10:
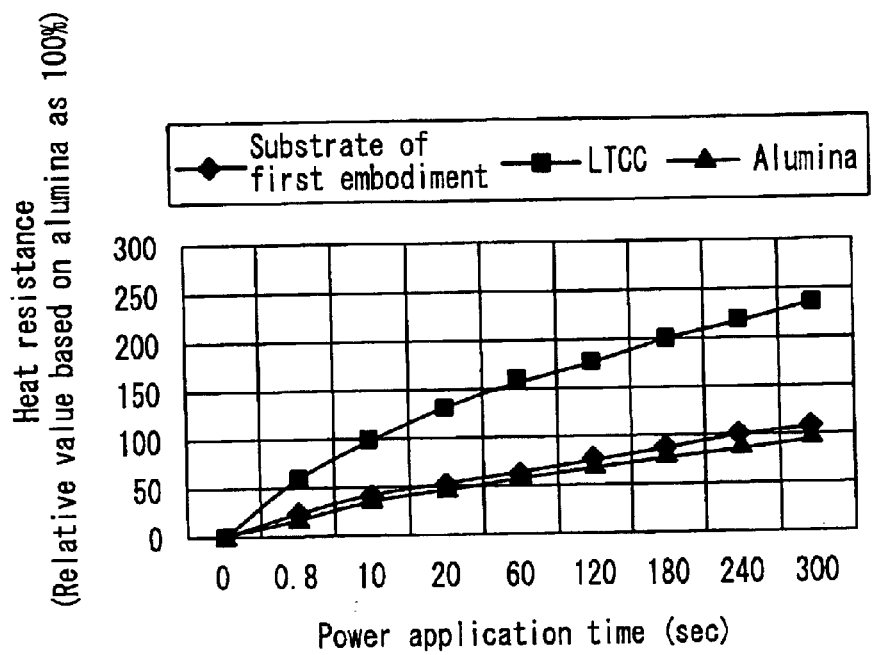
FIG. 10 is a graph showing heat dissipation characteristics in the first embodiment of the present invention.
Figure 11:
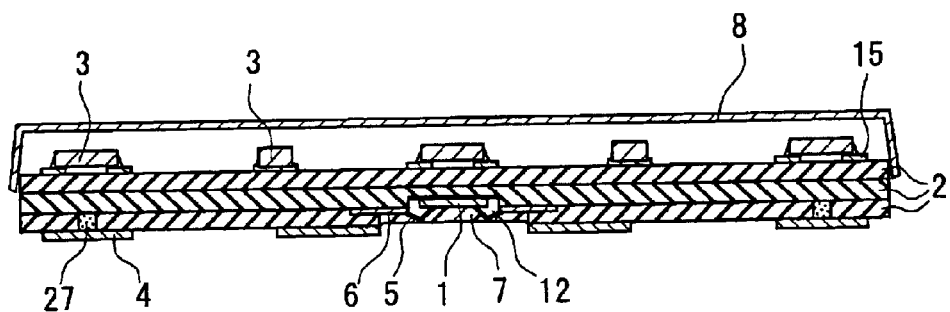
FIG. 11 is a cross-sectional view showing a conventional high-frequency amplifier circuit device.

FIG. 10 shows the heat dissipation characteristics of a substrate used in this embodiment, compared with an alumina substrate and a LTCC substrate. Since an alumina substrate having improved heat dissipation is used for the core material in this embodiment, the material for the LTCC substrate can be selected considering primarily a high-frequency characteristic, and the thickness of the material can be varied depending on the dielectric constants and the types of the layers. The LTCC substrate is advantageous particularly for including components such as resistors, capacitors and inductors, contributing downsizing of the substrates due to the decreasing number of the external components and lowering the impedance due to the shortened wiring. Furthermore, since a high-frequency power semiconductor element and a controlling semiconductor element are mounted on the surface and the back face of an alumina substrate, the length of the wire to connect the elements can be minimized by forming via holes in the alumina substrate. Moreover, by the use of alumina for the core material the transverse strength can be improved remarkably by about 1.5 times in comparison with a LTCC substrate.

The alumina substrate (thermal conductivity: 24 W/m·K) for the core material can be replaced by any of aluminum nitride (thermal conductivity: 135 W/m·K), graphite (thermal conductivity: 300 W/m·K), silicon carbide (thermal conductivity: 46 W/m·K) and boron nitride (thermal conductivity: 100 W/m·K), since each of the above-mentioned materials has a heat resistance of at least 10 W/m·K, thereby improving remarkably the transverse strength to at least 1.5 times that of a LTCC substrate.

In this first embodiment, the high-frequency power semiconductor element 1 is mounted on the cavity 12 of the first LTCC substrate 10, and the controlling semiconductor element 13 is mounted on the cavity 12 of the second LTCC substrate 11. Alternatively, the controlling semiconductor element 13 can be mounted on the cavity 12 of the first LTCC substrate 10, and the high-frequency power semiconductor element 1 can be mounted on the cavity 12 of the second LTCC substrate 11.

Second Embodiment

Figure 2:
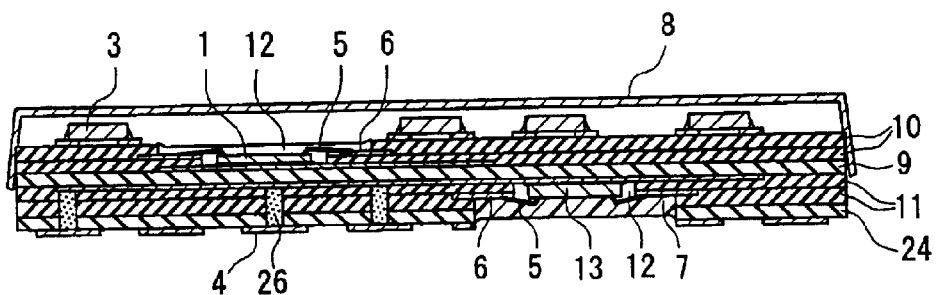
FIG. 2 is a cross-sectional view showing a semiconductor device according to a second embodiment of the present invention.

A second embodiment of the present invention will be described by referring to FIG. 2. FIG. 2 is a schematic cross-sectional view of a semiconductor device. This semiconductor device is a variation of the first embodiment, i.e., a second alumina substrate 24 is formed on the surface of the second ceramic substrate in the structure shown in FIG. 1A.

The outer dimension and thickness of the substrates are 10 mm and 1.5 mm respectively. On the upper surface of a first alumina substrate 9 as a core material, a first ceramic substrate 10 is formed while a second ceramic substrate 11 and a second alumina substrate 24 are formed on the lower surface. In other words, the second ceramic substrate is sandwiched by the first alumina substrate and the second alumina substrate.

Stepped cavities are formed in the first and second ceramic substrates, and wire connection pads are formed at the steps of the cavities.

The second alumina substrate 24 has a dielectric constant of 10 and a thickness of 0.2 mm. A cavity 12 is formed in the second alumina substrate 24 so as to correspond to the positions of the external connection electrode 4 and the cavity 12 of the second ceramic substrate 11. The dimension of the cavity of the second alumina substrate can be equal to or larger in some degree than that of the cavity of the second ceramic substrate. For example, when the cavity opening of the second ceramic substrate is 3.5 mm☐, the cavity opening of the second alumina substrate can be 3.7 mm☐, taking laminate displacement into consideration. Structures other than the above-noted ones are the same as the first embodiment.

Through-holes are formed in the LTCC substrate 11, which is filled with an electroconductive paste so as to form heat dissipation vias 26 that are connected electrically and thermally to the electrode 4. The heat dissipation vias 26 are arranged opposite to or in the vicinity of the high-frequency power semiconductor element 1. Therefore, heat generated at the high-frequency power semiconductor element 1 is conducted and dissipated through the alumina substrate 9, the heat dissipation vias 26 and the electrode 4 to a copper pattern of a printed circuit board to which this semiconductor device is packaged.

The high-frequency power semiconductor element 1 is mounted on a circuit pattern of the first alumina substrate on the first ceramic substrate and connected by a metal wire to a connection pad at a step of the cavity. A second semiconductor element is mounted on a circuit pattern of a first alumina substrate within the cavities of the second ceramic substrate, i.e., within the cavities of the second alumina substrate, and connected by a metal wire to a connection pad at the step of the cavity. The cavities mounted with the first and second semiconductor elements are sealed with epoxy resin for protecting the elements.

The semiconductor device is processed further by attaching a cap at the first ceramic substrate side or by sealing with resin. FIG. 2 shows an example to which a cap is attached.

In this embodiment, an alumina substrate having a thickness of 0.3 mm is used as a core material. Heat of the first semiconductor element is conducted directly to the first alumina substrate (thickness: 0.5 mm) and dissipated through the second ceramic substrate (thickness: 0.5 mm) to the second alumina substrate (thickness: 0.2 mm), thereby lowering the heat resistance further by about 15% in comparison with the semiconductor device described in the first embodiment. Furthermore, by using the substrate comprising dual layers of alumina substrates, the traverse strength of the entire substrate can be more or less doubled with respect to that of a LTCC substrate, namely, strength comparable to that of an alumina substrate can be secured.

In this second embodiment, the high-frequency power semiconductor element 1 is mounted on the cavity 12 of the first LTCC substrate 10, and the controlling semiconductor element 13 is mounted on the cavity 12 of the second LTCC substrate 11. Alternatively, the controlling semiconductor element 13 can be mounted on the cavity 12 of the first LTCC substrate 10, and the high-frequency power semiconductor element 1 can be mounted on the cavity 12 of the second LTCC substrate 11.

Third Embodiment

Figure 3:
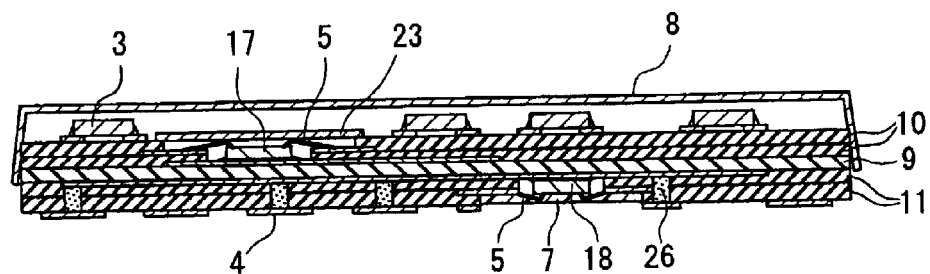
FIG. 3 is a cross-sectional view showing a semiconductor device according to a third embodiment of the present invention.

A third embodiment of the present invention will be described by referring to FIG. 3. FIG. 3 is a schematic cross-sectional view of a semiconductor device.

This semiconductor device is a variation of the first embodiment, having a three-layered structure. Specifically, LTCC multilayer substrates with stepped cavities are provided on the upper and lower surfaces of a high thermo conductive ceramic substrate such as an alumina substrate. The substrate has an outer dimension of 10 mm☐ and a thickness of 1.4 mm. The LTCC substrate provided on one surface of an alumina substrate 9 is a multi-layered substrate of two layers having a dielectric constant $\epsilon=7.8$ and a thickness of 0.6 mm. A stepped cavity of 2.5 mm☐ is formed on the substrate, and an external circuit pattern and a land for mounting external chip components are formed on the surface.

The alumina substrate has a dielectric constant $\epsilon=10$ and a thickness of 0.3 mm. The LTCC substrate 11 further formed on the back face of the alumina substrate 9 is a multi-layered substrate of two layers, having a dielectric constant $\epsilon=7.8$ and a thickness of 0.5 mm. A stepped cavity 12 of 2.5 mm☐ is formed on the substrate, and an electrode 4 for external connection is formed on the surface.

Through-holes are formed in the LTCC substrate 11, which are filled with an electroconductive paste so as to form heat dissipation vias 26 that are connected electrically and thermally to the electrode 4. The heat dissipation vias 26 are arranged in the vicinity of the switching element 18 (heating element).

This semiconductor device is a filter-equipped antenna switch for an antenna of a portable phone. A SAW filter 17 is adhered by a metal and an electroconductive adhesive to the interior of the cavity 12 of the LTCC substrate 10, and connected through a metal wire 5 to a connection pad 6 at the cavity step. A switching element 18 is adhered by a metal and an electroconductive adhesive to the cavity 12 of the LTCC substrate 11, and connected through a metal wire 5 to a connection pad 6 at the cavity step.

The SAW filter 17 is 1 mm☐, and 250 μm in thickness. The switching element 18 is 1 mm☐, and 150 μm in thickness. The cavity 12 including the switching element 18 is sealed with an epoxy resin for protecting the element. The SAW filter 17 is sealed by adhering a metal plate 23 to the LTCC substrate 10. The filter element can be a dielectric filter element or a LC filter element.

The SAW filter element 17 in the LTCC substrate 10 and the switching element 18 in the cavity of the LTCC substrate 11 can be exchanged with each other. On the surface of the LTCC substrate 10, an external chip component for constant adjustment of input/output of an antenna switch is mounted.

The thus obtained filter-equipped antenna switch semiconductor device has excellent heat dissipation characteristics similar to the first embodiment, and also improved traverse strength.

Though not shown in the drawing, similar effects can be obtained in the third embodiment by solder-packaging a resin package component of a SAW filter into the cavity 12 of the LTCC substrate 10, or by solder-packaging on a pattern land on the surface of the substrate.

Fourth Embodiment

Figure 4:
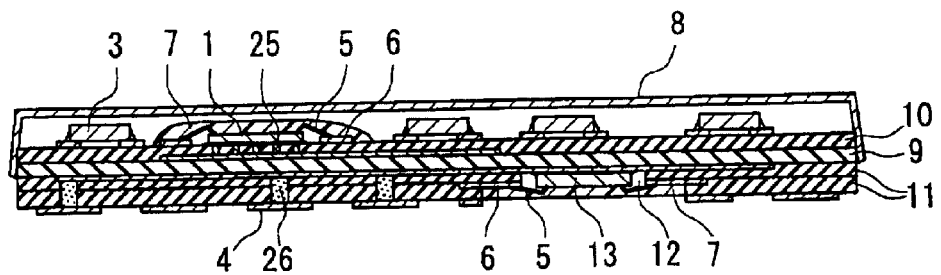
FIG. 4 is a cross-sectional view showing a semiconductor device according to a fourth embodiment of the present invention.

A fourth embodiment of the present invention will be described by referring to FIG. 4. FIG. 4 is a schematic cross-sectional view of a semiconductor device. This semiconductor device is a variation of the first embodiment. The structure is the same as FIG. 1 except that a region to mount a power semiconductor element is formed in the first ceramic substrate, in which via holes (thermal vias) for heat dissipation are formed and filled with a metal or a metal paste.

Figure 12:
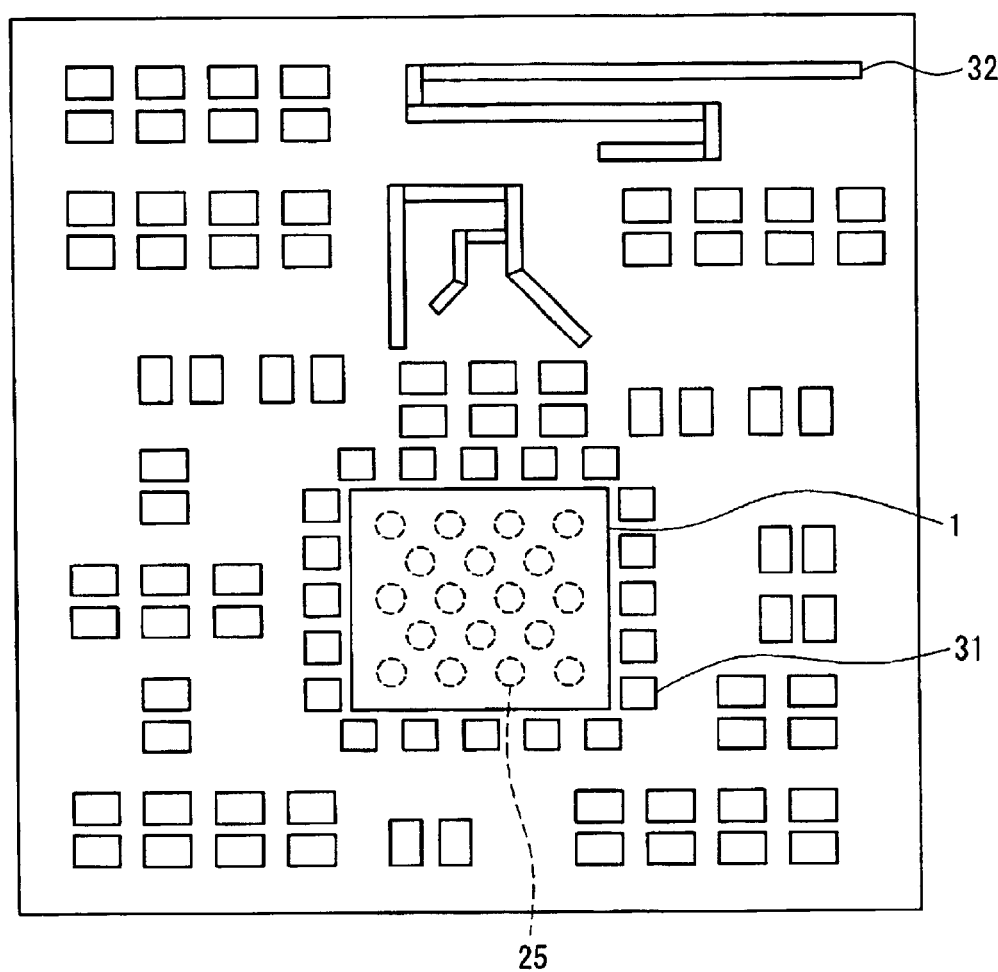
FIG. 12 is a plan view of FIG. 4.

In the fourth embodiment, a first ceramic substrate 10 is a monolayer LTCC substrate. In the region for mounting the power semiconductor element 1, twenty-three via holes 25, each of which is 0.2 mm in diameter, are disposed zigzag with a pitch of 0.45 mm, and filled with a silver paste. FIG. 12 shows an example of via holes disposed zigzag. FIG. 12 is a plan view of the surface of the LTCC substrate 10, on which a land of a high-frequency power semiconductor element 1, electrode pads 31, a wiring 32 are printed with a metal pattern. The land of the high-frequency power semiconductor element 1 is formed with a metal foil pattern on the LTCC substrate surface and chip-packaged. The land on the substrate is punched to form apertures (via holes) 25 in a zigzag pattern. The via holes 25 are filled with a metal paste having improved heat dissipation, which is contacted with the high thermo conductive alumina substrate 9 as shown in FIG. 4. The via holes 25 are disposed zigzag so as to provide the land with as many as via holes and improve the heat dissipation.

The silver paste in FIG. 4 is contacted with the alumina substrate 9 at the bottom of each via hole 25, so that the heat generated at the power semiconductor element 1 is conducted to the alumina substrate 9 through the silver paste in the via holes 25 of the LTCC substrate. Both the LTCC substrate 10 and the alumina substrate 9 have a thickness of 0.3 mm. The LTCC substrate 10 has a region for a pattern and a land for chip components 3 forming a matching circuit, in addition to the region for the power semiconductor element 1. Surface mounting components such as a resistor, capacitor, and an inductor are mounted around the power semiconductor element 1. The power semiconductor element 1 is adhered by the silver paste to the land of the LTCC substrate, connected by a metal wire 5 to the connection pad 6 on the surface of the LTCC substrate, and sealed with a potting resin 7 such as an epoxy resin.

The stepped cavity is not necessarily formed on the LTCC substrate at a position for mounting a power semiconductor element. When thermal vias filled with a metal or a metal-containing resin are formed exclusively at the regions for mounting the power semiconductor elements, the thus obtained heat resistance is substantially comparable to that of a power semiconductor element directly adhered to an alumina substrate. For example, the heat resistance in this embodiment is increased by only about 10% in comparison with the first embodiment. When the power semiconductor element is as large as several millimeters per side, the cavity structure as described in the first embodiment will enlarge the opening further. In a case in which the LTCC substrate is not more than 0.2 mm in thickness and relatively thin with regard to the opening, a non-fired sheet is easy to break during manufacture of the substrate. For such a case, it is advantageous to fill thermal vias for heat dissipation.

Figure 5:
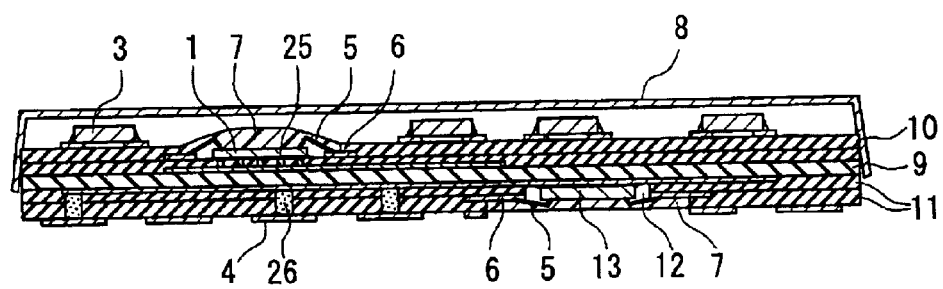
FIG. 5 is a cross-sectional view showing a semiconductor device in a variation of the fourth embodiment of the present invention.

FIG. 5 is a variation of the fourth embodiment. A first ceramic substrate 10 is a two-layered LTCC substrate having a stepped cavity. Specifically, the stepped cavity is formed in the upper layer while the lower layer forms the bottom of the cavity. A land pattern for mounting the power semiconductor element 1 is at the bottom of the cavity, and a via hole 25 is formed further below and filled with a silver paste. A wire bond pad is formed around the land pattern on the cavity bottom. The silver paste is contacted, at the lower part of the via hole 25, with the alumina substrate 9. The LTCC substrate is 0.5 mm in thickness, specifically, the upper layer is 0.3 mm and the lower layer is 0.2 mm. The LTCC substrate 10 is similar to the example in FIG. 3 in the via hole diameter, the pitch and the number. The power semiconductor element 1 is adhered into the cavity by a silver paste, and connected by a metal wire 5 to a connection pad 6. Furthermore, the interior of the cavity is sealed with a potting resin 7 such as an epoxy resin.

In any of FIGS. 4 and 5, through-holes are formed on the LTCC substrate 11, and filled with an electroconductive paste so as to form heat dissipation vias 26 that are connected electrically and thermally to the electrode 4. The heat dissipation vias 26 are arranged opposite to or in the vicinity of the high-frequency power semiconductor element 1. Therefore, heat generated at the high-frequency power semiconductor element 1 is conducted through the alumina substrate 9, the heat dissipation vias 26 and the electrode 4 to the copper pattern of a printed circuit board to which this semiconductor device is packaged.

In the case of FIG. 5, the step of the cavities serves to prevent the potting resin 7 from flowing out and to reduce the thickness of the resin.

Fifth Embodiment

Figure 6:
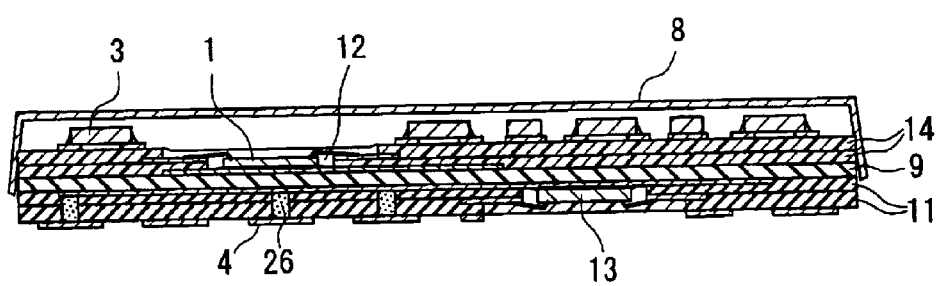
FIG. 6 is a cross-sectional view showing a semiconductor device according to a fifth embodiment of the present invention.

A fifth embodiment of the present invention will be described by referring to FIG. 6. FIG. 6 is a schematic cross-sectional view of a semiconductor device. This semiconductor device has a structure similar to that in the first embodiment, except that the LTCC substrate formed on the alumina substrate is replaced by a resin substrate. That is, an alumina ceramic substrate 9 as a core material is sandwiched by an upper resin substrate and a lower LTCC substrate so as to form a three-layered laminate. The resin substrate 14 and the LTCC substrate 11 are multilayer substrates having stepped cavities respectively. The laminated substrate has an outer dimension of 10 mm☐ and a thickness of 1.3 mm. The resin substrate 14 is a multi-layered substrate of two layers having a dielectric constant $\epsilon=4.5$ and a thickness of 0.5 mm. The resin substrate 14 has a stepped cavity 12 of 2.5×2 mm. On its surface, an external circuit pattern and a land for mounting external chip components are formed. At the cavity, the conductive pattern formed on the alumina substrate is exposed.

The alumina substrate as a core material and the LTCC substrate provided on the lower surface of the alumina substrate are the same as the first embodiment.

Through-holes are formed in the LTCC substrate 11, which is filled with an electroconductive paste so as to form heat dissipation vias 26 that are connected electrically and thermally to the electrode 4. The heat dissipation vias 26 are arranged opposite to or in the vicinity of the high-frequency power semiconductor element 1. Therefore, heat generated at the high-frequency power semiconductor element 1 is conducted and dissipated through the alumina substrate 9, the heat dissipation vias 26 and the electrode 4 to a copper pattern of a printed circuit board to which this semiconductor device is packaged.

The high-frequency power semiconductor element 1 is adhered by a metal and an electroconductive adhesive onto a pattern of the alumina substrate 9 within the cavity 12 of the resin substrate 14, and connected by a metal wire 5 to the connection pad 6 at the cavity step of the substrate 14. The high-frequency power semiconductor element 1 is 1.6×0.5 mm and 100 μm in thickness. On the surface of the substrate 14, chip components 3 such as a resistor, a capacitor and an inductor are solder-packaged. A controlling semiconductor element 13 is adhered by a pressure-sensitive adhesive tape and an electroconductive adhesive on the pattern of the alumina substrate 9 within the cavity 12 of the LTCC substrate 11, and connected by a metal wire 5 to the connection pad 6 at the cavity step of the substrate 11. The controlling semiconductor element 13 is 2.0 mm, and 150 μm in thickness.

The cavities mounted with the high-frequency power semiconductor element 1 and the controlling semiconductor element 13 are sealed with an epoxy resin in order to protect the elements.

Since the circuit on the surface of the resin substrate 14 is formed as a copper foil pattern, the impedance can be lowered further. Furthermore, since it is easy to set finely the width (40 μm) of each pattern and the gap (30 μm) between the patterns, preciseness in positioning the component land on the substrate 14 can be improved. Thereby, spacing among the mounted components is decreased, and thus the packaging density is improved. A circuit pattern with low resistance and excellent heat dissipation can be formed by using a thick copper foil. In addition, since a copper wiring is available, the packaging yield is improved due to the good solder wettability, the adhesion strength between the wiring and the substrate is improved, and the heat resistance of the solder can be improved. Among various advantages, the heat resistance of the solder is remarkable. Wiring of a ceramic substrate, which is formed by printing and firing a metal paste, has a relatively-inferior adhesion strength, and thus the conductor will be subjected often to a phenomenon called solder leaching when solder dipping is performed repeatedly. A copper foil will not cause such a problem.

For a LTCC substrate, some packaging methods such as coil formation using a fine pattern or a flip-chip packaging of a semiconductor element are useful only with certain limitations. This embodiment is useful for eliminating such limitations.

The remaining effects are the same as those in the first embodiment.

Sixth Embodiment

Figure 7:
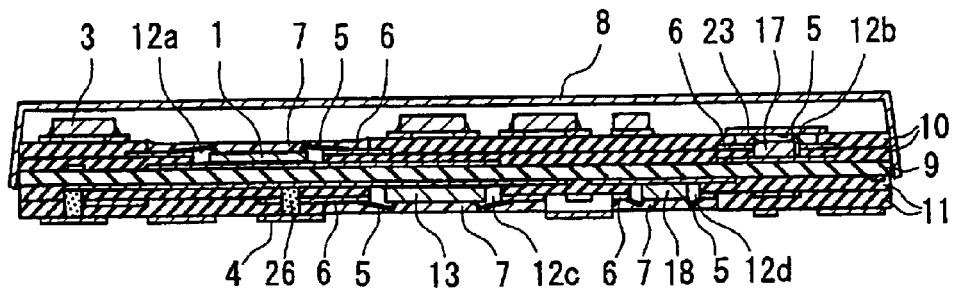
FIG. 7 is a cross-sectional view showing a semiconductor device according to a sixth embodiment of the present invention.

A sixth embodiment of the present invention will be described by referring to FIG. 7. FIG. 7 is a schematic cross-sectional view of a semiconductor device. This semiconductor device has a three-layered structure composed of a LTCC substrate, an alumina substrate and a LTCC substrate in this order when viewed from above. More specifically, LTCC multilayer substrates with a plurality of stepped cavities respectively are provided on the upper and lower surfaces of a high thermo conductive ceramic substrate such as an alumina substrate as a core material. The substrate has an outer dimension of 16 mm□ and a thickness of 1.4 mm. The LTCC substrate provided on the alumina substrate 9 is a multi-layered substrate of two layers having a dielectric constant $\epsilon=7.8$, a thickness of 0.6 mm. In the substrate, a stepped cavity 12a of 2.5×2 mm and a stepped cavity 12b of 2.5 mm□ are formed. On the surface, an external circuit pattern and a land for mounting external chip components are formed.

Between the two cavities 12a and 12b in the LTCC substrate 10, a circuit pattern connected to a ground is contained. At the two cavities, a conductor pattern formed on the alumina substrate is exposed.

The alumina substrate 9 as a core material has a dielectric constant $\epsilon=10$, and a thickness of 0.3 mm.

The LTCC substrate 11 on the back face of the alumina substrate is a multi-layered substrate of two layers having a dielectric constant $\epsilon=7.8$, and a thickness of 0.5 mm. On the substrate, a stepped cavity 12c of 3.5 mm□ and a stepped cavity 12d of 2.5 mm□ are formed. An electrode 4 for external connection is formed on the surface. Between the cavities 12c and 12d on the LTCC substrate 11, a circuit pattern connected to the ground is contained. At the two cavities a conductor pattern formed on the alumina substrate is exposed.

Though not shown in the drawing, the LTCC substrates 10 and 11 include respectively resistors, capacitors and inductors. Therefore, the number of external components is decreased, thereby decreasing the dimension of the substrate and lowering the impedance of the wiring.

The power semiconductor element 1 is adhered by a metal and an electroconductive adhesive onto the pattern on the alumina substrate 9 within the cavity 12a of the LTCC substrate 10, and connected by a metal wire 5 to a connection pad 6 at the cavity step of the substrate 10. A filter element 17 such as SAW is adhered to the cavity 12b of the substrate 10 by a metal and an electroconductive adhesive, and connected by a metal wire 5 to a connection pad 6 at cavity step of the substrate 10. The power semiconductor element 1 is 1.6×0.5 mm, 100 μm in thickness. The SAW filter is 1 mm□ and 250 μm in thickness.

On the other hand, a controlling semiconductor element 13 for driving and controlling the power semiconductor element 1 is adhered by a pressure-sensitive adhesive tape and an electroconductive adhesive onto the pattern of the alumina substrate 9 within the cavity 12c of the LTCC substrate 11 on the back face of the alumina substrate, and connected by a metal wire 5 to a connection pad at the cavity step of the substrate 11. A switching element 18 is adhered by a metal and an electroconductive adhesive to the cavity 12d of the substrate 11, and connected by a metal wire 5 to a connection pad 6 at the cavity step of the substrate 11.

The controlling semiconductor element is 2.0 mm□, and 150 μm in thickness. The switching element is 1 mm□, and 150 min thickness.

The cavities mounted with the power semiconductor element, the controlling semiconductor element, and the switching element are sealed with an epoxy resin 7 in order to protect the elements, and the SAW filter is covered with the metal plate 23.

The semiconductor device is processed further by attaching a cap 8 at the side of the LTCC substrate 10, and by sealing with an epoxy resin at the entire face of the LTCC substrate. FIG. 7 shows an example attaching a metal cap.

By sandwiching a circuit pattern connected to a ground between a SAW filter and a power semiconductor element of a LTCC substrate formed on the surface of an alumina substrate, the interference of signals between the power semiconductor element and the SAW filter can be decreased to maximize the permeation characteristic of the filter. Similarly for the LTCC substrate formed on the back face of the alumina substrate, the interference between the controlling semiconductor element and the switching element can be decreased by sandwiching, between the controlling semiconductor element and the switching element, a circuit pattern connected to a ground.

Thereby, a transmission Tx module with decreased interference among elements can be provided. The Tx module has a power semiconductor element, a filter element such as SAW, a controlling semiconductor element and a switching element, where the heat resistance is reduced by directly mounting the power semiconductor element on a pattern on an alumina substrate.

High-frequency elements such as a duplexer, isolator, and a balun can be mounted as well.

The other effects are as same as the third embodiment.

Seventh Embodiment

Figure 8:
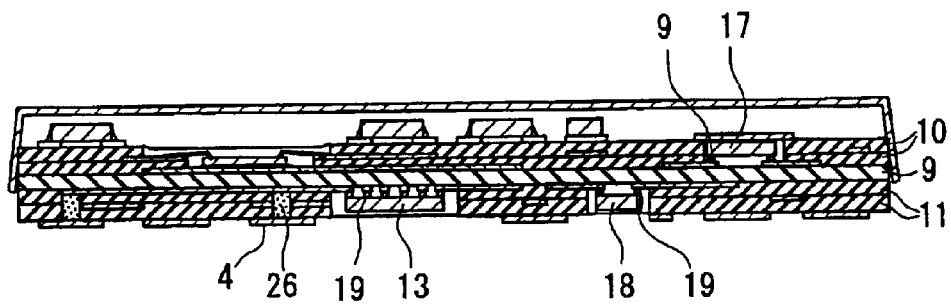
FIG. 8 is a cross-sectional view showing a semiconductor device according to a seventh embodiment of the present invention.

A seventh embodiment of the present invention will be described by referring to FIG. 8. The seventh embodiment relates to a variation of the semiconductor device shown in the sixth embodiment, i.e., a transmission Tx module. FIG. 8 is a schematic cross-sectional view of a semiconductor device, i.e., a transmission Tx module. In the transmission Tx module in this embodiment, a connection between the alumina substrate 9 and either of a filter element 17 or a controlling semiconductor element 13 such as a SAW packaged on the circuit pattern of the substrate, or a switching element 18, is carried out by flip-chip bonding with a solder 19 instead of a metal wire. In a case of using a LTCC substrate, it is required to form a thermal via at the dies-bonding part in order to improve the heat dissipation characteristics, inevitably causing irregularities of 10 μm to 20 μm. In this embodiment, since the alumina substrate used as a core material provides good heat dissipation characteristics, formation of a thermal via is not required. As a result, the irregularity at the dies-bonding part is decreased to 5 μm or less, thereby allowing flip-chip bonding of the elements and the patterns on the substrate.

Since any of the filter element 17 such as SAW, the controlling semiconductor element 13 or the switching element 18 is mounted by flip-chip bonding using a solder 19 on the alumina substrate 9, the thickness of the LTCC substrates 10 and 11 can be reduced as long as the substrates can be packaged. For example, when a metal wire is used for packaging of the controlling semiconductor element, each cavity should have a depth of not less than 500 μm to correspond to a height of the wire loop top and a thickness of a sealing resin. On the other hand, since flip-chip packaging requires a depth of at least 350 μm, the whole thickness can be reduced by 150 μm.

Furthermore, the impedance and the stray capacitance can be reduced in comparison with a case of connection by a metal wire.

For example, the impedance can be reduced by 15% in comparison with a case of a metal wire. Furthermore, since a connection pad at the side of the substrate can be omitted, the wall face of each cavity can be flattened so as to decrease the diameter of the cavity. Specifically, a cavity without a step can have an opening smaller by about 1 mm in the X- and Y-directions in comparison with a stepped cavity. Other effects are common to those in the third embodiment.

Eighth Embodiment

Figure 9:
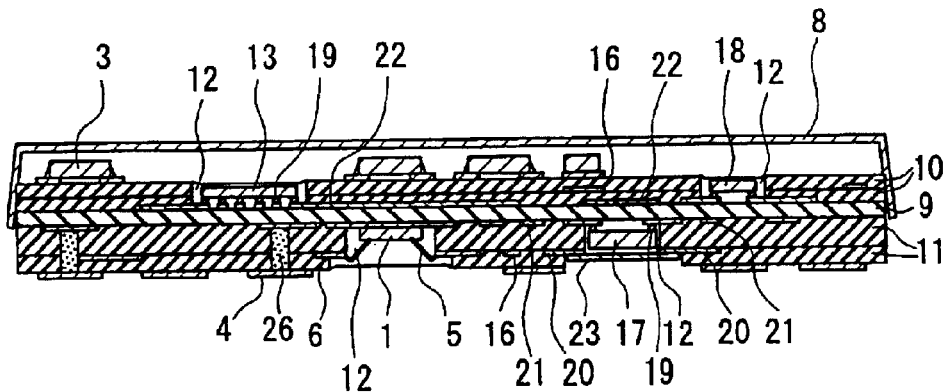
FIG. 9 is a cross-sectional view showing a semiconductor device according to an eighth embodiment of the present invention.

An eighth embodiment of the present invention will be described by referring to FIG. 9. The eighth embodiment is another variation of a semiconductor device, i.e., a transmission Tx module, shown in the sixth embodiment. FIG. 9 is a schematic cross-sectional view of a semiconductor device. In the semiconductor device of the sixth embodiment, or the transmission Tx module, the LTCC substrate 10 formed on a surface of the alumina substrate 9 has two cavities 12. A controlling semiconductor element 13 and a switching element 18 are packaged to a pattern wiring of the alumina substrate 9 by flip-chip bonding. Since each of the cavities 12 is packaged by flip-chip bonding, wire bond pads are not required, and thus the cavities without steps are formed. A cavity for a controlling semiconductor element is 2.5 mm□ and a cavity for a switching element is 1.5 mm□, respectively smaller by about 1 mm in comparison with the third embodiment using a metal wire 5 for connection. Since the dimensions of the cavities can be decreased, areas for run-length of the pattern circuit of the external component 3 on the LTCC substrate 10 can be increased.

The LTCC substrate 11 provided on the back face of the alumina substrate 9 has two stepped cavities 12 to which a power semiconductor element 1 and a filter element 17 such as SAW are packaged. The power semiconductor element 1 is attached by a metal and an electroconductive adhesive onto the circuit pattern of the alumina substrate 9, and connected by a metal wire 5 to a connection pad 6 at the cavity step. The circuit pattern connected to the ground is formed on the stepped cavity 12 to house the filter element 17. More specifically, the circuit pattern is formed on the cavity step 20, a region 21 located in the vicinity of the cavity bottoms, and a region 22 located on the back face of the cavities.

The filter element 17 is packaged by flip-chip bonding using a solder 19 to a circuit pattern of the alumina substrate 9 within the stepped cavities 12. At that time, the metal plate 23 is adhered by a metal and an electroconductive adhesive, by using a metallic pattern at the step 20 of the cavity 12 so as to cover the element.

In the above-mentioned cavities for filter elements, the circuit pattern of the ground arranged to surround the filter element serves to improve isolation between the filter element and other elements, and thus interference of signals is decreased to enable to maximize the permeation characteristics of the filter.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A semiconductor device comprising:

as a core substrate of a high thermo conductive ceramic substrate having circuit patterns on opposed surfaces, the high thermo conductive ceramic substrate having on one surface a first circuit board of at least one layer having a first cavity structure, and on the other surface a second circuit board of at least one layer having a second cavity structure;

a first active element mounted on the circuit pattern on the high thermo conductive ceramic substrate within the first cavity;

a second active element mounted on the circuit pattern on the high thermo conductive ceramic substrate within the second cavity; and an external electrode integrated with the surface of the second circuit board, the first circuit board surface being covered; wherein
a heat dissipation via is formed on the second circuit board, the high thermo conductive ceramic substrate and the external electrode on the surface of the second circuit board are connected thermally to each other, and heat of at least one active element selected from the first active element and the second active element is dissipated outward through the high thermo conductive ceramic substrate, the heat dissipation via and the external electrode on the surface of the second circuit board.

2. The semiconductor device according to claim 1, wherein on a lower surface of the second circuit board, a second high thermo conductive ceramic substrate made of the same material as the first high thermo conductive ceramic substrate and having a third cavity structure is formed so that the second cavity and the third cavity are overlapped.

3. The semiconductor device according to claim 1, wherein either the first active element or the second semiconductor element is a high-frequency power semiconductor element, and the other active element is a controlling semiconductor element having a function of driving and controlling the power semiconductor element.

4. The semiconductor device according to claim 1, wherein at least one passive element selected from the group consisting of an inductor, a capacitor and a resistor is packaged on the surface of the first circuit board.

5. The semiconductor device according to claim 1, wherein either the first active element or the second active element is a filter element, and the other active element is a switching element.

6. The semiconductor device according to claim 1, wherein the first circuit board has on its surface a region for mounting a power semiconductor element, and a via hole filled with a metal or a metal-containing resin is formed in the region so as to be connected thermally with the high thermo conductive ceramic substrate.

7. The semiconductor device according to claim 1, wherein the first circuit board and the second circuit board are at least one kind of circuit board selected from the group consisting of a ceramic substrate and a substrate prepared by impregnating a resin in a reinforcing fiber structure.

8. The semiconductor device according to claim 1, wherein a plurality of the cavity structures are provided on the both surfaces of the high thermo conductive ceramic substrate.

9. The semiconductor device according to claim 8, wherein an electroconductive via or a circuit pattern to be connected to a ground is formed on an inner layer or a surface layer of spacing between the plural cavities of the first circuit board.

10. The semiconductor device according to claim 8, wherein an electroconductive via or a circuit pattern to be connected to a ground is formed on an inner layer or a surface layer of spacing between the plural cavities of the second circuit board.

11. The semiconductor device according to claim 8, wherein a power semiconductor element and a filter element are mounted respectively on the circuit pattern on the high thermo conductive ceramic substrate within the cavity of the first circuit board.

12. The semiconductor device according to claim 11, wherein the filter element mounted on the first circuit board is packaged by flip-chip bonding.

13. The semiconductor device according to claim 8, wherein a controlling element and a switching element are mounted on the circuit pattern on the high thermo conductive ceramic substrate within cavities of the second circuit board.

14. The semiconductor device according to claim 13, wherein the controlling element or the switching element is packaged by flip-chip bonding.

15. The semiconductor device according to claim 1, wherein the heat dissipation external electrode on the surface of the second circuit board is connected to a ground.

16. The semiconductor device according to claim 1, wherein the high thermo conductive ceramic substrate comprises a first ceramic substrate and a second ceramic substrate, and a plurality of stepped cavities are formed in the second ceramic substrate.

17. The semiconductor device according to claim 16, wherein circuit patterns to be connected to a ground are formed in regions in the vicinity of the cavities of the first and second ceramic substrates, at the steps of the cavities and regions in the vicinity of the cavity steps, a region in the back face of the cavity for a filter element of the high thermo conductive ceramic substrate, and among the plural cavities on the second ceramic substrate;

the controlling semiconductor element and the switching element are mounted by flip-chip bonding onto the circuit pattern of the high thermo conductive ceramic substrate within a cavity of the first ceramic substrate, a power semiconductor element and at least one filter element selected from the group consisting of a SAW filter element, a dielectric filter element and a LC filter element, are mounted on the circuit pattern on the high thermo conductive ceramic substrate within the cavity of the second ceramic substrate, the SAW filter element is mounted by flip-chip bonding; and the circuit pattern at the cavity steps of the second ceramic substrate and a metal plate are adhered by an electroconductive adhesive and sealed.

18. The semiconductor device according to claim 1, wherein the high thermo conductive ceramic substrate is made of a material selected from the group consisting of alumina, aluminum nitride, graphite, silicon carbide, and boron nitride.

19. The semiconductor device according to claim 1, wherein the heat dissipation via is formed by being filled with an electroconductive paste containing a metal filler of 65 wt % to 95 wt % and a thermosetting resin of 5 wt % to 35 wt % and curing the electroconductive paste.

20. The semiconductor device according to claim 1, wherein the heat dissipation via is arranged on the back face sides or in the vicinity of the first active element and the second active element.

\* \* \* \* \*